United States Patent [19]

Sneddon et al.

[11] Patent Number: 5,126,168
[45] Date of Patent: Jun. 30, 1992

[54] PREPARATION OF GROUP IIIA-VA COMPOUNDS SUCH AS BORON NITRIDE, AND OF BORON NITRIDE FILMS AND COATINGS

[75] Inventors: Larry G. Sneddon, Havertown; Jeffrey Beck, Philadelphia, both of Pa.

[73] Assignee: The Trustees of the University of Pennsylvania, Philadelphia, Pa.

[21] Appl. No.: 304,959

[22] Filed: Feb. 1, 1989

[51] Int. Cl.$^5$ .................. B05D 3/02; C01B 21/064; C01B 25/00; C01B 21/06
[52] U.S. Cl. ............................. 427/226; 148/437; 420/555; 420/577; 420/576; 420/579; 423/289; 423/290; 423/299; 423/409; 423/412; 427/248.1; 427/255; 427/343; 427/344
[58] Field of Search .............. 427/226, 343, 344, 255, 427/248.1; 501/96, 126, 127; 423/290, 289, 299, 409, 412; 420/579, 576, 577; 148/555, 437

[56] References Cited

U.S. PATENT DOCUMENTS

| | | | |
|---|---|---|---|
| 4,535,007 | 8/1985 | Cannady | 427/226 |
| 4,801,439 | 1/1989 | Blum et al. | 423/284 |
| 4,810,436 | 3/1989 | Johnson | 264/82 |
| 4,832,895 | 4/1990 | Johnson | 264/82 |
| 4,833,103 | 5/1989 | Agostinelli et al. | 427/226 |

OTHER PUBLICATIONS

Pipes, B. R., McCullough, R. L., Chou, T. W., *Scientific American*, 1986, 193-203.
Freeman, G. B., Lackey, W. S., *Proc. Annu. Meet. Electron Microsc. Soc. Am.* 46th, 1988, 740-741.
Brun, M. K., Singh, R. N., *Ceram. Eng. Sci. Proc.*, 1987, 8, 636-643.
Brun, M. K., Singh, R. N., *Adv. Ceram. Mater.*, 1988, 5, 506-509.
Singh, R. N., Brun, M. K., *Adv. Ceram. Mater.*, 1988, 3, 235-7.
Gmelin Handbuch der Anorganishen Chemie, Boron Compounds, 1980, Third Supplement, vol. 3, Sec. 4.
Lowden, R. A., Besmann, T. M., Stinton, D. P., *Ceram. Bull.* 1988, 67, 350-355.
Narula, C. K., Schaeffer, R., Paine, R. T., *J. Am. Cer. Soc.* 1987, 109, 5556-5557.
Narula, C. K., Paine, R. T., Schaeffer, R., *Polymer Prep. (Am. Chem. Soc. Div. Polym. Chem.)* 1987, 28, 454.
Narula, C. K., Paine, R. T., Schaeffer, R., in Better Ceramics Through Chemistry II, Brinker, C. J., Clark, D. E., Ulrich, D. R., Eds., MRS Symposium Proceedings 73, Materials Research Society: Pittsburgh, PA, 1986, 383-388.
Narula, C. K., Paine, R. T., Schaeffer, R., in Inorganic and Organometallic Polymers, Zeldin, M., Wynne, K. J., Allcock, H. S., Eds., ACS Symposium Series 360, American Chemical Society: Washington, D.C. 1988, 378-384.
Paciorek, K. J. L., Harris, D. H., Krone-Schmidt, W., Kratzer, R. H., Technical Report No. 4, Ultrasystems Defense and Space Inc., Irvine, CA 1978.
Paciorek, K. J. L., Krone-Schmidt, W., Harris, D. H., Kratzer, R. H., Wynne, K. J., in Inorganic and Organometallic Polymers, Zeldin, M., Wynne, K. S., Allcock, H. S., Eds., ACS Symposium Series 360, American Chemical Society: Washington, D.C. 1988, 27, 3271.

(List continued on next page.)

*Primary Examiner*—Janyce Bell
*Attorney, Agent, or Firm*—Woodcock, Washburn, Kurtz, Mackiewicz & Norris

[57] ABSTRACT

Lewis base-borane complexes such as $(CH_3)_2S \cdot BHBr_2$ are utilized as molecular precursors for the formation of both bulk powders, films and coatings of boron nitride. The complexes are subjected to slow heating under an ammonia atmosphere to displace the base and pyrolyze the resulting complex to BN. Analogous processes may be used to prepare Group IIIA-VA compounds of the formula MM′ where M is selected from the group consisting of B, Al, Ga, In, and Tl, and M′ is selected from the group consisting of N, P, As, Sb and Bi.

18 Claims, 4 Drawing Sheets

OTHER PUBLICATIONS

Rees, W. S., Seyferth, D., presented at the 194th National Meeting of the American Chemical Society, New Orleans, LA, Sep. 1987, Paper INOR 446.

Rees, W. S., Jr., Seyferth, D., *J. Am. Ceram. Soc.*, 1988, 71, C194–C196.

Mirabelli, M. G. L., Sneddon, L. G., *Inorg. Chem.* 1988, 27, 3721.

Mirabelli, M. G. L., Lynch, A. T., Sneddon, L. G., *Solid State Ionics*, in press.

Geanangel, R., Mukherjee, P. J., Wang, J. S., presented at the Boron–USA Conference, Dallas, TX, Apr. 1988.

Shore, S. G., Boddeker, K. W., *Inorg. Chem.* 1963, 3, 915–916.

Niedenzu, K., Dawson, J. W., *Boron–Nitrogen Compounds*, Academic Press, Inc., New York 1965.

Bracke, P. et al., "Inorganic Fibres and Composite Materials, A Survey of Recent Developments," Chapter 5, pp. 49–57 (Pergamon Press).

Sheldon, J. C., Smith, B. C., *Quart. Rev. Chem. Soc.*, 1960, 14, 200.

Hu, M. G., Genanangel, R. A., Wendlandt, W. W., *Thermochimica Acta.* (1978) 23, 249–255.

Liepins, R. A., Genanangel, R. A., Komm, R., *Inorg. Chem.* 1983, 22, 1684–1686.

Walker, B. E. Jr., Rice, R. W., Becher, P. F., Bender B. A., Coblenz, W. S., *Ceram. Bull*, 1983, 62, 916–923.

Liepins, R., Jorgensen, B., Jahn, R., Genanangel, R. A., Komm, R., *Proc. Anu. Int. Conf. Plasma Chem. Technol.*, 1982, 171–174.

Genanangel, R. A., Hu, M. G., *Inorg. Chem.* 1979, 18, 3297–3301.

PREPARATION OF GROUP IIIA-VA COMPOUNDS SUCH AS BORON NITRIDE, AND OF BORON NITRIDE FILMS AND COATINGS

BACKGROUND OF THE INVENTION

This invention relates to a new method wherein Lewis base-borane adducts are utilized as molecular precursors for the formation of both bulk powders, films and coatings of boron nitride.

Interest in the development of ceramic/ceramic composite materials stems from a desire to improve structural integrity over that of a single ceramic component. For example, ceramic fiber reinforced ceramics are known to exhibit increased strength and toughness due to a lessening of crack propagation. Pipes, B.R., McCullough, R.L., Chou, T.W., *Scientific American*, 1986, 193-203; Bracke, P., Schurmans, H., Vehoest, J., "Inorganic Fibers and Composite Materials", EPO Applied Technology Series Volume 3, Pergamon, New York, 1984. A suitable ceramic fiber coating can enhance the strength of a ceramic fiber/ceramic composite by increasing the interfacial shear strength between the fiber and matrix and thus increase the potential for both debonding and fiber pullout (toughness). Brun, M.K., Singh, R.N., *Ceram. Eng. Sci. Proc.*. 1987, 8, 636–643; Freeman, G.B., Lackey, W.S., *Proc. Annu. Meet. Electron Microsc. Soc. Am.*, 46th, 1988, 740–741; Brun, M.K., Singh, R.N., *Adv. Ceram. Mater.*, 1988, 5, 506–509; Singh, R.N., Brun, M.K., *Adv. Ceram. Mater.*, 1988, 3, 235-7. Another benefit of fiber coatings is that they may serve as a diffusion barrier between fibers and matrix materials and, thus, inhibit chemical reactions between these materials at high temperatures. Boron nitride (BN) is a non-oxide ceramic which because of its excellent strength and chemical resistance is an attractive prospect as a ceramic coating for fibers in ceramic fiber/ceramic composites.

Previous methods for the formation of coatings or thin films of BN have generally relied on the use of vapor deposition (CVD) techniques, employing mixtures of $NH_3$ and volatile borane species such as $BCl_3$, $B_2H_6$ and $B_3N_3H_6$. Gmelin Handbuch der Anorganischen Chemie, Boron Compounds, 1980, Third Supplement, Vol. 3, Sec 4 and references therein. For example, conventional CVD techniques have been used for the preparation of thin films of BN from a $BCl_3$—$NH_3$—$H_2$ mixture at 1000°–1400° C., while plasma assisted CVD of a $B_2H_6$—$NH_3$—$H_2$ mixture results in a deposition of a thin layer of BN in the temperature range of 400°–700° C. Lowden, R.A., Besmann, T.M., Stinton, D.P., *Ceram. Bull.* 1988, 67, 350–355. Although the CVD technique offers an effective pathway for depositing a uniform layer of a ceramic on a variety of substrates, these procedures are often time consuming and costly.

An alternative method for generating BN coatings could employ a coatable, non-volatile chemical precursor which could be thermally decomposed to BN on a desired substrate. Indeed, several boron based polymer systems displaying this set of properties have been developed as potential precursors to BN coatings, although such applications have not been reported. Narula, C.K., Schaeffer, R., Paine, R.T., *J. Am. Cer. Soc.* 1987, 109, 5556-5557; Narula, C.K., Paine, R.T., Schaeffer, R., *Polymer Prep. (Am. Chem. Soc. Div. Polym. Chem.)* 1987, 28, 454; Narula, C.K., Paine, R.T., Schaeffer, R. in Better Ceramics Through Chemistry II, Brinker, C.J., Clark, D.E., Ulrich, D.R. Eds, MRS Symposium Proceedings 73, Materials Research Society:Pittsburgh Pa., 1986, 363-388; Narula, C.K., Paine, R.T., Schaeffer, R., in Inorganic and Organometallic Polymers, Zeldin, M., Wynne, K.J., Allcock, H.S. Eds., ACS Symposium Series 360, American Chemical Society: Washington, D.C. 1988, 378-384; Paciorek, K.J.L., Harris, D.H., Krone-Schmidt, W., Kratzer, R.H., Technical Report No. 4, Ultrasystems Defense and Space Inc., Irvine, Calif. 1978; Paciorek, K.J.L., Krone-Schmidt, W., Harris, D.H., Kratzer, R.H., Wynne, K.J. in Inorganic and Organometallic Polymers, Zeldin, M., Wynne, K.S., Allcock, H.S., Eds., ACS Symposium Series 360, American Chemical Society: Washington, D.C. 1988, 27, 3271; Rees, W.S., Seyferth, D., presented at the 194th National Meeting of the American Chemical Society, New Orleans, La., Sep. 1987, Paper INOR 446; Rees, W.S., Jr., Seyferth, D., *J. Am. Ceram. Soc.*, 1988, 71, C194–C196; Mirabelli, M.G.L., Sneddon, L.G., *Inorg. Chem.* 1988, 27, 3721; Mirabelli, M.G.L., Lynch, A.T., Sneddon, L.G., *Solid State Ionics*, in press.

Simple molecular precursors to BN would also be desirable and would offer a number of advantages over vapor deposition methods including control of stoichiometry, ceramic formation at lower temperatures and higher processability. Perhaps the simplest species containing boron and nitrogen which might be considered as a potential precursor to BN is the Lewis base-borane $NH_3$ $BH_3$. The decomposition reactions of $NH_3$ $BH_3$ have, in fact, been previously studied by Geanangel who examined reactions of $NH_3.BH_3$ both in solution and in the solid state. In solution, in aprotic solvents, the compound is found to decompose above 80° C. to various species including cyclotriborazane and borazine. Geanangel, R., Mukherjee, P.J., Wang, J.S., presented at the Boron-USA Conference, Dallas, Tex., April 1988. This result is consistent with earlier observations that, upon standing, solutions of $NH_3.BH_3$ deposit an insoluble material $[BH_2(NH_3)_2]^+BH_4^-$, a known precursor of BN cyclics. Shore, S.G., Boddeker, K.W., *Inorg. Chem.* 1963, 3, 915–916; Niedenzu, K., Dawson, J.W., *Boron-Nitrogen Compounds*, Academic Press, Inc., New York 1965; Stock, A., *Hydrides of Boron and Silicon*, Cornell Univ. Press, Ithaca, N.Y. 1933; Sheldon, J.C., Smith, B.C., *Quart. Rev. Chem. Soc.*, 1960, 14, 200; Hu, M.G., Geanangel, R.A., Wendlandt, W.W., *Thermochimica Acta.* (1978) 23, 249-255. Thermal decomposition of $NH_3.BH_3$ in the solid-state leads to a variety of products depending on the conditions employed. Heating the compound above its melting point (115°-116° C.) results in partial sublimation and some decomposition leading to the formation of $B_2H_6$, $B_3N_3H_6$ and $(BNH)_x$ polymeric materials. Liepins, R.A., Geanangel, R.A., Komm, R., *Inorg. Chem.* 1983, 22, 1684–1686. High temperature pyrolysis (950° C.) of $NH_3.BH_3$ in a platinum covered glassy carbon crucible has been reported to result in a 65% ceramic yield of BN. Walker, B.E. Jr., Rice, R.W., Becher, P.F., Bender, B.A., Coblenz, W.S., *Ceram. Bull*, 1983, 62, 916–923.

Despite the fact that bulk pyrolysis of $NH_3.BH_3$ leads to the formation of BN powder, the applications of this material as a chemical precursor for the generation of BN coatings appear somewhat limited. Indeed, plasma assisted CVD of $NH_3.BH_3$, even at high energy and lengthy reaction times, produces a material with high hydrogen content, $BNH_{0.5}$. Liepins, R., Jorgensen, B., Jahn, R., Geanangel, R.A., Komm, R., *Proc. Anu. Int. Conf. Plasma Chem. Technol.*, 1982, 171-174. Among the inherent drawbacks in the use of NH$_3$.BH$_3$ for coating or film formation are its low solubility and stability in most solvent systems, and its volatility under mild thermal conditions. Such problems may, however, be minimized with appropriate tailoring of the base-borane complex. For example, introduction of halogen species to the boron center would result in a reduction of volatility of the base-borane complex. Unfortunately, the compound [NH$_3$.BHBr$_2$] has never been reported, and based on previous work by Geanangel (Genanangel, R.A., Hu, M.G., *Inorg. Chem.* 1979, 18, 3297-3301), would be expected to be extremely unstable in solution.

SUMMARY OF THE INVENTION

A suitable molecular precursor for the production of boron nitride bulk powders, films and coatings has now been found. It has been found that a Lewis base-borane complex of the formula Base.BXYZ, where X, Y and Z are independently H, Cl, Br or I, may be pyrolyzed under an ammonia atmosphere to yield BN in high chemical yield. Advantageously, these molecular precursors for BN are highly soluble in a variety of polar and non-polar solvents and/or are low melting solids, and are thus highly processable.

The method of this invention may be extended beyond the production of merely BN to the production of a variety of IIIA-VA materials, including but not limited to boron phosphide, gallium arsenide, aluminum phosphide, etc. This invention therefore relates to a method of preparing a material of the formula MM', where M is selected from the group consisting of B, Al, Ga, In and Tl and M' is selected from the group consisting of N, P, As, Sb and Bi, comprising (a) providing a complex of a Lewis base and a compound of the formula MXYZ where M, X, Y and Z are as defined above, (b) displacing, with a compound of the formula M'H$_3$ where M' is as defined above, the Lewis base from said complex, and (c) subjecting the resulting product to pyrolyzing conditions.

Since the above-mentioned method is particularly useful for preparing BN, this invention further relates to methods of coating substrates, such as fibers, with BN comprising coating said substrate with said Lewis base-borane, displacing with ammonia the base from such base-borane complexes and subjecting the coated substrate to pyrolyzing conditions. This invention also relates to methods of preparing films of BN comprising casting a film of said Lewis base-borane complex, displacing with ammonia the base from such complex and subjecting the cast film to pyrolyzing conditions. Still further, this invention relates to the BN coated substrates and films prepared using the above-mentioned methods.

DETAILED DESCRIPTION OF THE INVENTION

Figure 1:
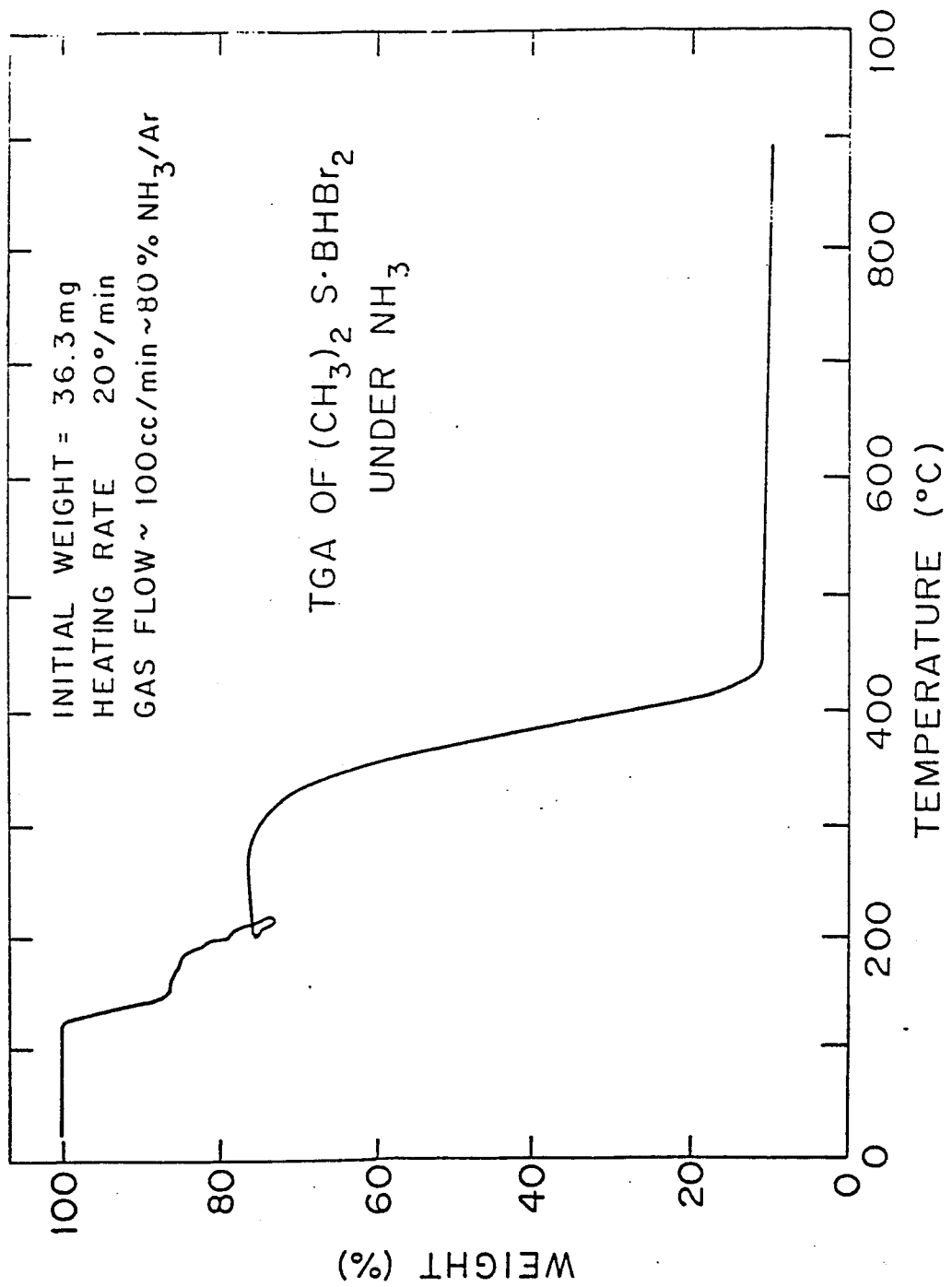
FIG. 1 is a thermogravimetric analysis (TGA) of the conversion of a sample of (CH$_3$)$_2$S.BHBr$_2$ to BN under an NH$_3$ atmosphere.

The process of this invention may be illustrated by the following reaction scheme, illustrating the conversion of the complex (CH$_3$)$_2$S.BHBr$_2$:

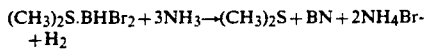

$$(CH_3)_2S.BHBr_2 + 3NH_3 \rightarrow (CH_3)_2S + BN + 2NH_4Br + H_2$$

Lewis bases suitable for use in this invention are those which will form weak base adducts with the desired MXYZ compound. Suitable bases include dialkyl sulfides and linear and cyclic ethers. The preferred base is dimethyl sulfide, and, generally, any base of similar strength could be used.

Examples of preferred Lewis base-borane complexes for use in preparing BN include the complexes (CH$_3$)$_2$S.BHBr$_2$, (CH$_3$)$_2$S.BBr$_3$ and (CH$_3$)$_2$S.BH$_3$, with (CH$_3$)$_2$S.BHBr$_2$ being particularly preferred. The use of these Lewis base-borane complexes, and of (CH$_3$)$_2$S.BHBr$_2$ in particular as molecular precursors for BN offer a number of unique advantages over either conventional CVD routes or routes using other potential chemical precursors for the formation of BN. First, the complexes are stable at ambient temperatures and not extremely air sensitive. This allows solutions for coating to be prepared and stored. Second, the dialkyl-sulfide base stabilizes the BBr$_2$H fragment allowing the formation of molecular coatings. Third, the dimethyl-sulfide is easily and quantitatively displaced in the conversion process and thus can be recovered for regeneration of base-borane. Fourth, the decomposition of the base-borane such as (CH$_3$)$_2$S.BHBr$_2$ is efficient and occurs at lower temperatures than in CVD processes. Fifth, the byproducts of the ceramic conversion, i.e., (CH$_3$)$_2$S, H$_2$ and NH$_4$Br, are easily evaporated or sublimed away from the BN product under normal pyrolysis conditions. Finally, the base-borane starting materials are easily prepared or may be purchased commercially.

The Lewis base-borane complexes used as starting materials in the methods of this invention may be used as neat liquids as many of them are low melting solids (i.e., liquids near room temperature, but best results in coating substrates have been achieved using dilute (e.g., about 5-20%) solutions of the complexes in suitable solvents including halocarbons such as methylene chloride and hydrocarbons.

The first step in converting the Lewis base-borane complexes to BN involves displacement of the Lewis base (e.g., (CH$_3$)$_2$S) by ammonia. This is best accomplished by subjecting the complex to slow heating (5°-10° C./min.) under an ammonia atmosphere. TGA results indicate that displacement occurs in the range of about 80°-150° C. and is quantitatively complete by about 250° C. It is convenient to purge the base-borane complex with ammonia at room temperature for five to ten minutes to remove air and establish an ammonia atmosphere. The resulting product is then subjected to pyrolyzing conditions, preferably, continued slow heating under ammonia to a temperature in the range of about 25° C. to 1350° C.

Although the methods of this invention may be utilized to prepare bulk BN, they are also advantageously used in other applications such as the preparing of films and coating of substrates. For example, thin BN films may be made by casting thin films of the base-borane complex and then subjecting the cast film to suitable pyrolyzing conditions. Substrates such as but not limited to fibers (e.g., alumina, SiC, graphitic carbon and metallic fibers), fiber bundles and woven ceramic cloth and items such as silicon chips may be coated with the base-borane complex and the coated substrate then subjected to suitable pyrolyzing conditions to yield a BN coated substrate. In both applications, the availability of a processable ceramic precursor allows for preparation of the ceramic article under milder conditions than those required by CVD methods which must be used with less processable precursors.

The methods and products of this invention are further illustrated in the following examples which are not intended to limit the scope of the invention. All manipulations described below were performed using standard high vacuum or inert atmosphere techniques as described by Shriver, D.F., Drezdon, M.A., Manipulations of Air Sensitive Compounds, 2nd Ed., Wiley: New York 1986, hereby incorporated by reference. Fiber coatings were performed in glovebags purged with argon.

Materials. Ammonia was purchased from Matheson and used as received. Dibromoborane-methyl sulfide complex was purchased from Aldrich, either neat or as a 1.0 M solution in dichloromethane. Fiber PRD-166 ($Al_2O_3/ZrO_2$) and Nicalon (SiC) were obtained from DuPont Experimental Station and pretreated by heating to 600° C. in air.

Physical Measurements and Instrumentation. Diffuse reflectance infrared spectra were obtained on a Perkin Elmer 7770 Fourier transform spectrophotometer with the appropriate diffuse reflectance attachment. Thermogravimetric (TGA) analyses were performed on a Dupont 2100 Thermal Analyzer with a 951 TGA. X-ray powder diffraction was obtained on a Rigaku Geigerflex X-ray powder diffractometer. Scanning electron microscopy (SEM) was performed on a Phillips 500 Scanning Electron Microscope. Auger electron spectra (AES) were obtained on a Perkin Elmer Phi 600 Auger Electron Spectroscope. Densities were measured by flotation in methylene chloride and diiodomethane. Elemental Analyses were performed at Galbraith Laboratories, Knoxville, Tenn.

EXAMPLE 1

Bulk Pyrolysis of $(CH_3)_2S.BHBr_2$ at 25° C. to 1350° C.

Into a boron nitride boat, under argon was syringed 2.62 g of $(CH_3)_2S.BHBr_2$. The boat was placed in a quartz tube which was immediately transferred to a tube furnace. After exposure of the sample to $NH_3$ at room temperature for 5 min, the furnace temperature was increased at a rate of 10° C./min to a maximum temperature of 1250° C. and held at this temperature for 6 h. The sample was then cooled under argon to room temperature. The resulting material was white with a slight pinkish tinge and weighed 0.26 g. The sample was then ground with a mortar and pestle, placed in a boron nitride boat and heated under $NH_3$ to a maximum temperature of 1350° C. for 3 h and subsequently maintained at this temperature for 6 additional h. After cooling under argon, the material was pure white in appearance and had a weight of 0.249 g corresponding to a chemical yield of 89.5% and a ceramic yield of 9.9% (theoretical 10.6%).

Figure 2:
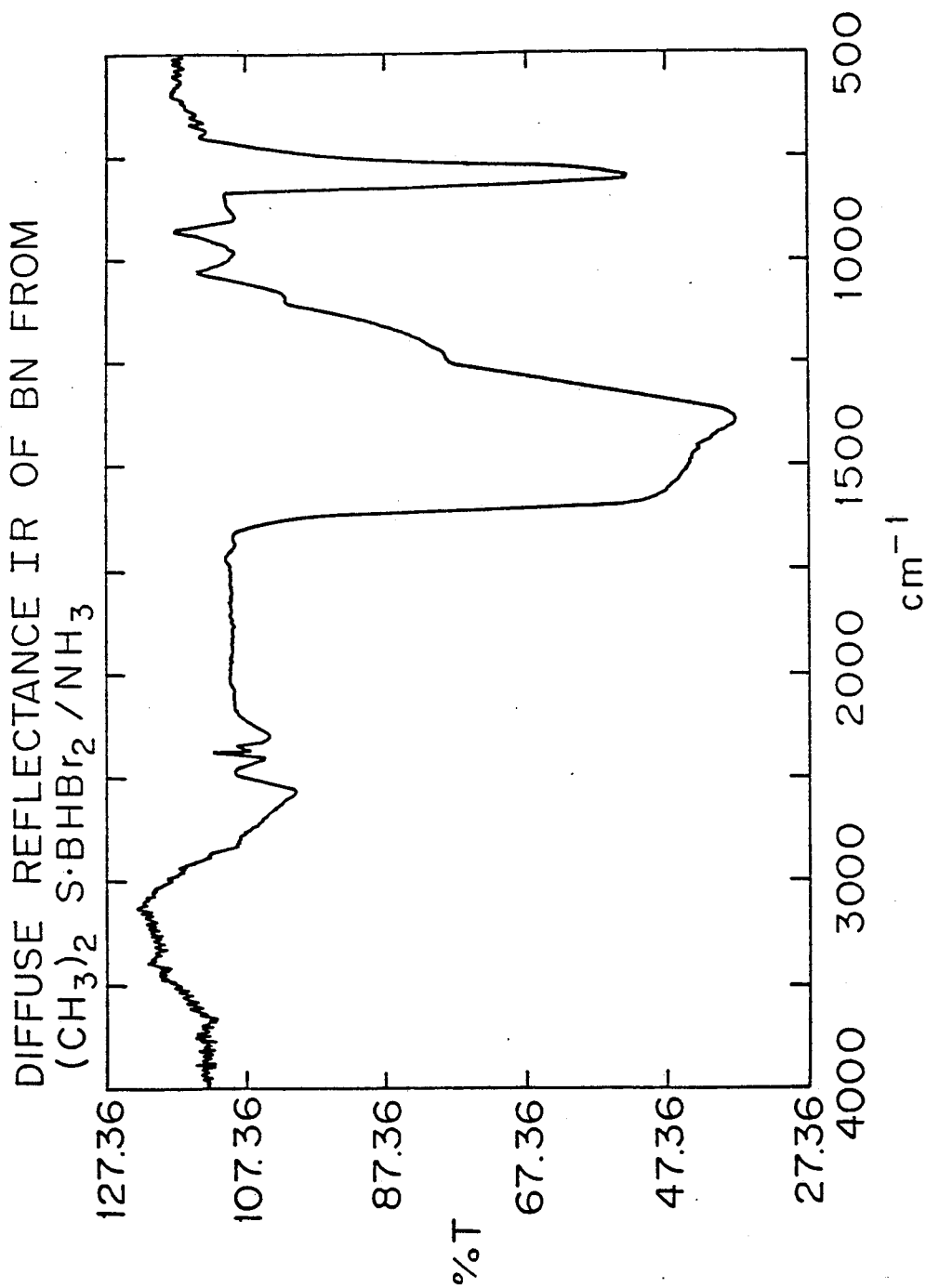
FIG. 2 is a diffuse reflectance infrared spectrum for the boron nitride product of Example 1.

The boron nitride produced in this manner was found to be analytically pure, (Anal. Calcd for BN: B, 43.55; N, 56.45, Found B, 44.40; N, 52.43, C, 0.18; H, 0.17; S, 0.032) and exhibited an IR spectrum (FIG. 2) consistent with those reported for boron nitride containing a broad BN stretching band over the frequency range 1556–1390 $cm^{-1}$ along with a strong adsorption at 794 $cm^{-1}$ which has been assigned to a B-N-B bending vibration. The X-ray powder diffraction data indicated the presence of turbostratic BN. Turbostatic BN is also afforded in pyrolyses at 1000° C. Hexagonal BN can be prepared at 1450°–1700° C. BN: 002 reflection, d=3.39 Å. IR (diffuse): 3640 w, 2551 w, 2394 w, 2281 w, 1556 vs, vbr, 1390 vs, vbr, 1249 m, 1101 w, 985 w, 882 w, 794 s. Density: 1.8 g/mL.

The conversion of $(CH_3)_2S.BHBr_2$ to BN under an $NH_3$ atmosphere was also monitored by TGA (FIG. 1). In this experiment 0.036 g of $(CH_3)_2S.BHBr_2$ was placed in a platinum boat and heated in the TGA apparatus under 100 cc/min of $NH_3$ until a final temperature of 1100° C. was reached. After cooling under $NH_3$, 0.0038 g of a white material was obtained, corresponding to a ceramic yield of 10.5%. An initial weight loss of 26% occurred between 25° C. and 200° C., which may be attributed to displacement of $(CH_3)_2S$ by $NH_3$ in the base-borane complex. No further losses are observed until 270° C. At this temperature a large rapid weight loss was observed ending at 450° C. The final weight loss was 90.4% corresponding to 9.6% ceramic yield. Thus, the TGA study of the conversion of $(CH_3)_2S.BHBr_2$ to BN are consistent with the bulk pyrolysis reactions.

EXAMPLE 2

Bulk Pyrolysis of $(CH_3)_2S.BHBr_2$ at 25° C. to 250° C.

In a similar experiment to that described above, 1.82 g of $(CH_3)_2S.BHBr_2$ was pyrolyzed under ammonia at a rate of 10° C./min to a maximum temperature of 250° C., and held at this temperature for 1 h. The sample was then cooled under argon to room temperature. The resulting material was white with a slight orange tinge and weighed 0.56 g, corresponding to a weight loss of 30.8%. (Anal. Found B, 5.25; N, 17.42; C, 0.10; H, 3.75; S, 0.12; Br, 70.27.) IR (Diffuse) 3434 (w), 3138 (s), 3033 (s), 2803 (m), 2364 (w), 1961 (m), 1720 (m), 1509 (m), 1402 (s), 1114 (w), 782 (m), 687 (m), 600 (m). These analyses confirm that $(CH_3)_2S$ is essentially quantitatively displaced at 250° C. Diffuse reflectance also indicated the presence of $NH_4Br$.

The reaction of $(CH_3)_2S.BHBr_2$ with gaseous $NH_3$ to a maximum temperature of 255° C. was also carried out in the TGA. In this experiment 0.094 g of $(CH_3)_2S.BHBr_2$ was placed in a platinum boat and heated in the TGA under 100 cc/min of $NH_3$ until a final temperature of 255° C. was reached. After cooling under $NH_3$, the resulting material was white in appearance and weighed 0.060 g, corresponding to a weight loss of 35.6%. (Anal. Found B, 5.49; N, 16.08; C, 0.32; H, 3.82; S, 0.14; Br, 68.75). IR (Diffuse) 3433 (w), 3132 (s), 3033 (s), 2801 (m), 2363 (w), 1954 (w), 1719 (m), 1402 (s), 1132 (m), 774 (m), 711 (m).

EXAMPLE 3

Fiber Coatings

Alumina or Nicalon (SiC) fibers were coated by dipping the fibers into a 1M (17%) solution of $(CH_3)_2S.BHBr_2$ in $CH_2Cl_2$ under nitrogen. The fibers were then placed in a boron nitride boat which was subsequently transferred to a tube furnace. A slow ammonia flow was then passed over the fibers for 5-10 min. The furnace temperature was then increased at a rate of 10° C./min to a maximum temperature of 1000° C. The fibers were subsequently cooled to room temperature under argon flow. The resulting coated fibers were examined by a combination of SEM and AES.

Figure 3:
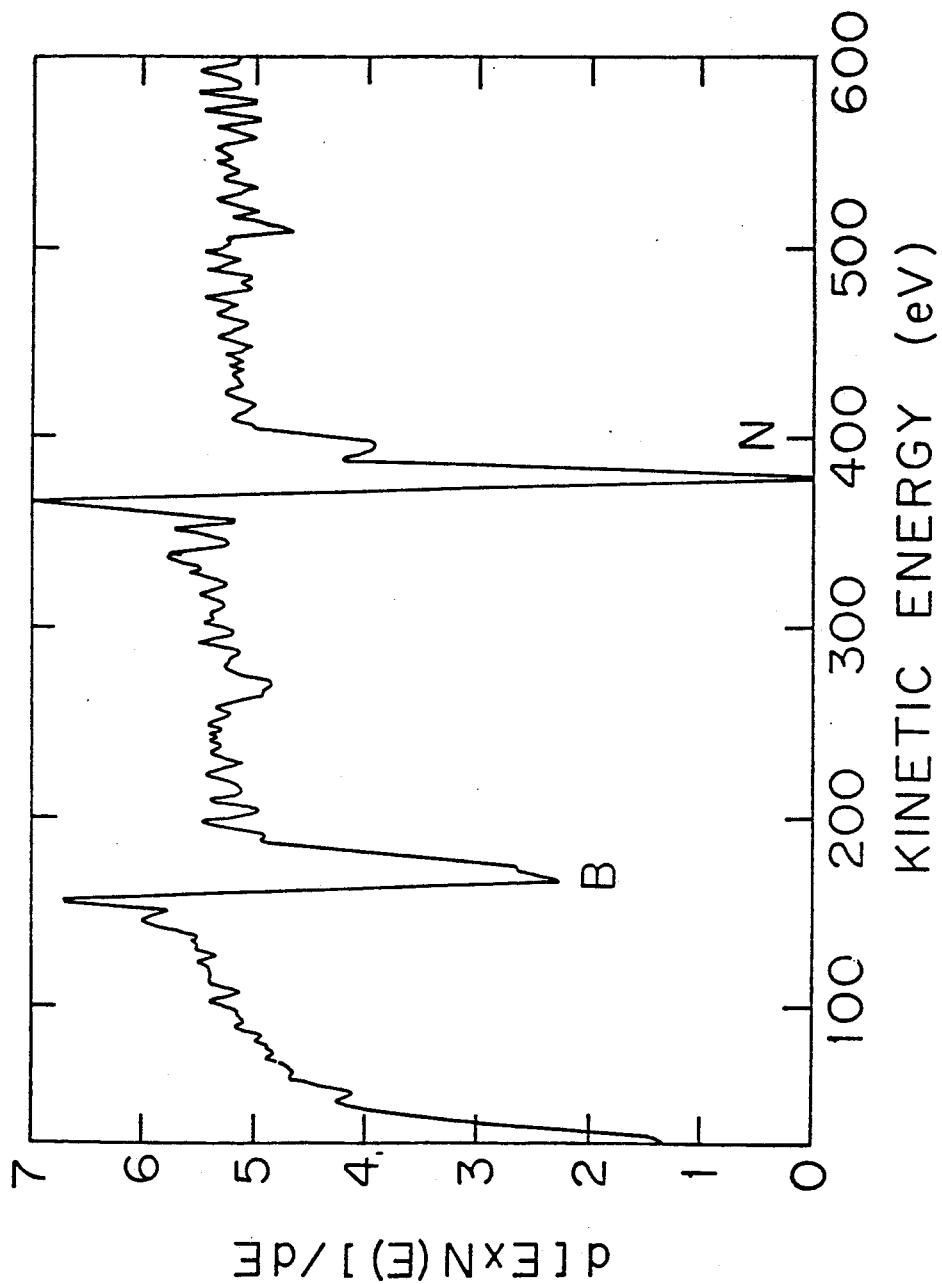
FIG. 3 is an Auger Electron Spectrum of a BN-coated alumina fiber according to this invention.

Scanning electron micrographs (SEM) of coated and uncoated alumina fibers evidence a uniform BN coating of approximately 0.2–0.4μ. Confirmation of the nature of the coated material was obtained by Auger Electron Spectroscopy as shown in FIG. 3. The spectrum reveals major peaks at 179 eV (B) and 379 eV (N) with very low levels of (C) 212 eV and (O) 510 eV. Further study of the fiber showed the coating to be uniform over the entire fiber surface. A depth profile study of the coating indicated a general thickness of 2500 Å.

Figure 4:
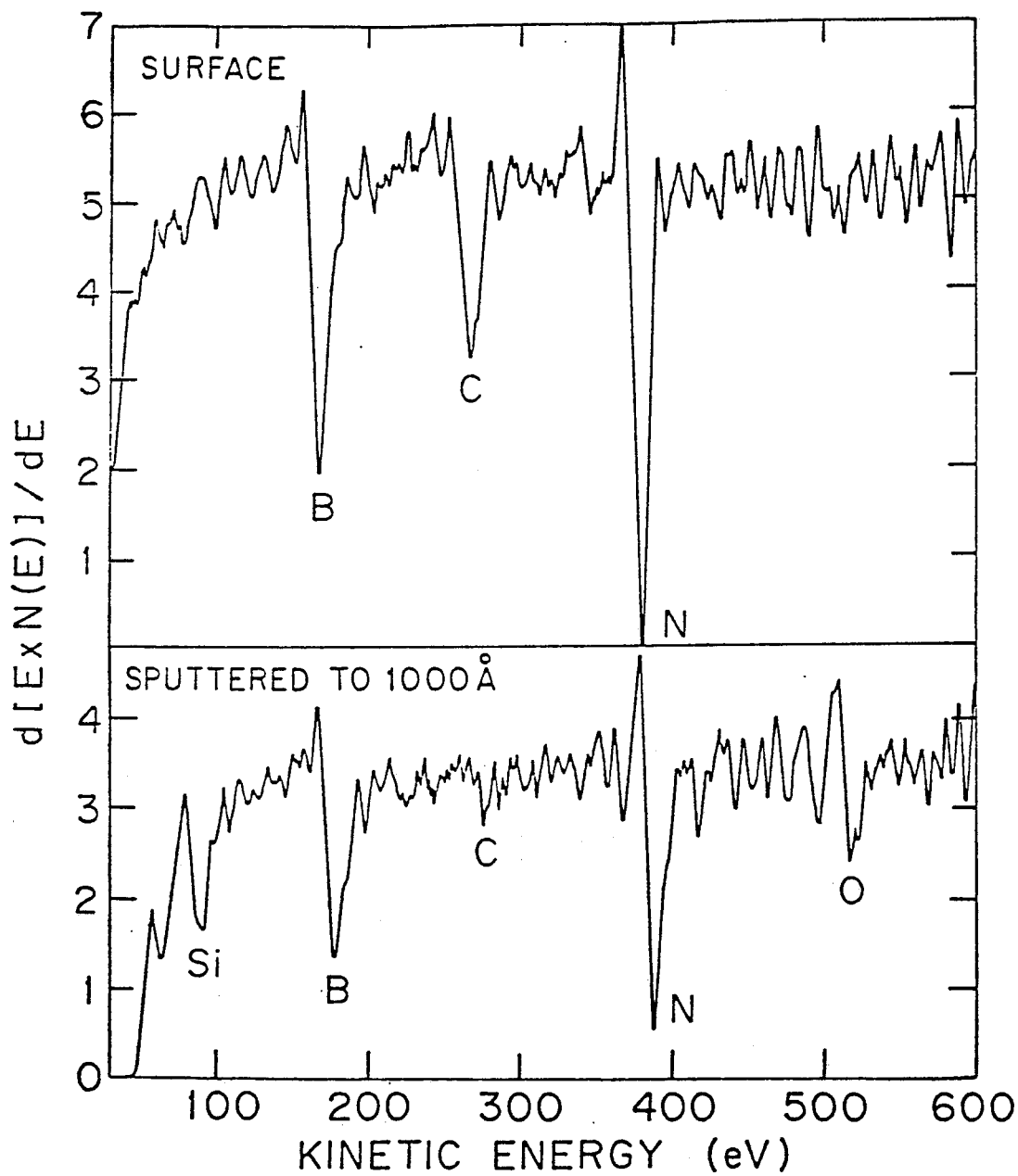
FIG. 4 is an Auger Electron Spectrum and a depth profile of a BN-coated SiC fiber according to this invention.

SEM of the coated and uncoated SiC fibers also evidenced a BN coating. In addition several areas containing BN aggregates were also apparent. The Auger spectrum and a depth profile of a BN coated SiC fiber are shown in FIG. 4. The surface analysis shows the presence of B and N and an additional smaller peak for C. Electron sputtering to 1000 Å gave the expected B and N peaks and additionally Si (92 eV) and O (510 eV) peaks indicative of slight penetration into the fiber core.

Lighter or heavier coatings could be obtained by dipping the fibers in more dilute or concentrated solutions, respectively.

What is claimed is:

1. A method of preparing a material of the formula MM', where M is selected from the group consisting of B, Al, Ga, In and Tl and M' is selected from the group consisting of N, P, As, Sb and Bi, comprising
    (a) providing a complex of a Lewis base and a compound of the formula MXYZ where M is as defined above and where X, Y and Z are independently H, Cl, Br or I;
    (b) displacing, with a compound of the formula M'H$_3$ where M, is as defined above, the Lewis base from said complex; and
    (c) subjecting the resulting product to pyrolyzing conditions.

2. The method of claim 1 where M=B and M'=N.

3. The method of claim 1 where said Lewis base is selected from the group consisting of dialkyl sulfides and cyclic and linear ethers.

4. The method of claim 3 where said Lewis base is a dialkyl sulfide.

5. The method of claim 2 where said Lewis base is a dialkyl sulfide.

6. The method of claim 1 where X=H and Y and Z each=Br.

7. The method of claim 2 where said complex is selected from the group consisting of (CH$_3$)$_2$S.BHBr$_2$, (CH$_3$)$_2$S.BBr$_3$ and (CH$_3$)$_2$S.BH$_3$.

8. The method of claim 7 where said complex is (CH$_3$)$_2$S.BHBr$_2$.

9. The method of claim 1 where said base is displaced by slowly heating said complex to a temperature in the range of at least about 80° C. under an atmosphere M'H$_3$.

10. The method of claim 1 where said pyrolyzing conditions comprise slow heating to a temperature in the range of about 25° to 1350° C.

11. The method of claim 2 wherein boron nitride is prepared by a process comprising slowly heating to a temperature in the range of about 25° to 1350° C., under an ammonia atmosphere, a Lewis base-borane complex of the formula (R')(R'')$_2$S.BXYZ where R' and R'' are alkyl and where X, Y and Z are independently, H, Cl, Br or I.

12. A method of preparing a coated substrate comprising
    (a) coating said substrate with a Lewis base-borane complex of the formula (R')(R'')$_2$S.BXYZ where R' and R'' are alkyl and where X, Y and Z are independently, H, Cl, Br or I, provided that at least one of X, Y and Z is other than H;
    (b) displacing, with ammonia, the base from said complex; and
    (c) subjecting the resulting coated substrate to pyrolyzing conditions.

13. The method of claim 12 wherein said Lewis baseborane complex is (CH$_3$)$_2$S.BHBr$_2$.

14. The method of claim 12 wherein said substrate is selected from the group consisting of fibers, fiber bundles and woven cloths.

15. The method of claim 14 wherein said fibers are selected from the group consisting of alumina, SiC, carbon and metallic fibers.

16. The method of claim 12 wherein said substrate is a silicon chip or other semiconductor.

17. A method of preparing a BN film comprising
    (a) casting a film of a Lewis base-borane complex of the formula (R')(R'')$_2$S.BXYZ where R' and R'' are alkyl and where X, Y and Z are independently, H, Cl, Br or I, provided that at least one of X, Y and Z is other than H;
    (b) displacing, with ammonia, the base from said complex; and
    (c) subjecting the resulting film to pyrolyzing conditions.

18. A method of preparing a material of the formula MM', where M is selected from the group consisting of B, Al, Ga, In and Tl and M' is selected from the group consisting of N, P, As, Sb and Bi, comprising
    (a) providing a complex of a Lewis base and a compound of the formula MXYZ where M is as defined above and where X, Y and Z are independently H, Cl, Br or I;
    (b) contacting said complex, under pyrolyzing conditions, with M'H$_3$ where M' is as defined above.

* * * * *

UNITED STATES PATENT AND TRADEMARK OFFICE
CERTIFICATE OF CORRECTION

PATENT NO. : 5,126,168  
DATED : June 30, 1992  
INVENTOR(S) : Sneddon et al.

Page 1 of 5

It is certified that error appears in the above-identified patent and that said Letters Patent is hereby corrected as shown below:

Column 2, line 36 delete "$(CH_3)_2S.BHBr_2$" and insert therefor --$(CH_3)_2S \cdot BHBr_2$--.

Column 2 line 6 delete "Genanangel" and insert therefor --Geanangel--.

Column 2 line 8 delete "Genanangel" and insert therefor --Geanangel--.

Column 2 line 12 delete "Genanangel" and insert therefor --Geanangel--.

Column 2 line 15 delete "Genanangel" and insert therefor --Geanangel--.

Column 2, line 28 delete "$NH_3\ BH_3$. The decomposition reactions of $NH_3\ BH_3$" and insert therefor --$NH_3 \cdot BH_3$. The decomposition reactions of $NH_3 \cdot BH_3$--.

Column 2, line 30 delete "$NH_3.BH_3$" and insert therefor --$NH_3 \cdot BH_3$--.

Column 2, line 37 delete "$NH_3.BH_3$" and insert therefor --$NH_3 \cdot BH_3$--.

Column 2, line 38 delete "$[BH_2(NH_3)2]^+BH_4-$," and insert therefor --$[BH_2(NH_3)_2]^+BH_4^-$,--.

Column 2, line 47 delete "$NH_3.BH_3$" and insert therefor --$NH_3 \cdot BH_3$--.

Column 2, line 54 delete "$NH_3.BH_3$" and insert therefor --$NH_3 \cdot BH_3$--.

UNITED STATES PATENT AND TRADEMARK OFFICE
CERTIFICATE OF CORRECTION

PATENT NO. : 5,126,168
DATED : June 30, 1992
INVENTOR(S) : Sneddon et al.

It is certified that error appears in the above-identified patent and that said Letters Patent is hereby corrected as shown below:

Column 2, line 59 delete "$NH_3.BH_3$" and insert therefor --$NH_3 \cdot BH_3$--.

Column 2, line 63 delete "$NH_3.BH_3$" and insert therefor --$NH_3 \cdot BH_3$--.

Column 3, line 1 delete "$NH_3.BH_3$" and insert therefor --$NH_3 \cdot BH_3$--.

Column 3, line 9 delete "$[NH_3.BHBr_2]$" and insert therefor --$[NH_3 \cdot BHBr_2]$--.

Column 3, line 10 delete "Genanangel" and insert therefor --Geanangel--.

Column 3, line 19 delete "$Base.BXYZ$" and insert therefor --$Base \cdot BXYZ$--.

Column 3, line 59 delete "$(CH_3)_2S.BHBr_2$" and insert therefor --$(CH_3)_2S \cdot BHBr_2$--.

Column 4, line 6 delete "$(CH_3)_2S.BHBr_2$" and insert therefor --$(CH_3)_2S \cdot BHBr_2$--.

Column 4, line 8 delete "$(CH_3)_2S.BHBr_2$" and insert therefor --$(CH_3)_2S \cdot BHBr_2$--.

Column 4, line 18 delete "$(CH_3)_2S.BHBr_2$" and insert therefor --$(CH_3)_2S \cdot BHBr_2$--.

Column 4, line 18 delete "$(CH_3)_2S.BBr_3$" and insert therefor --$(CH_3)_2S \cdot BBr_3$--.

UNITED STATES PATENT AND TRADEMARK OFFICE
CERTIFICATE OF CORRECTION

PATENT NO. : 5,126,168

DATED : June 30, 1992

INVENTOR(S) : Sneddon et al.

It is certified that error appears in the above-identified patent and that said Letters Patent is hereby corrected as shown below:

Column 4, line 18 delete "$(CH_3)_2S.BH_3$" and insert therefor -- $(CH_3)_2S \cdot BH_3$ --.

Column 4, line 19 delete "$(CH_3)_2S.BHBr_2$" and insert therefor -- $(CH_3)_2S \cdot BHBr_2$ --.

Column 4, line 21 delete "$(CH_3)_2S.BHBr_2$" and insert therefor -- $(CH_3)_2S \cdot BHBr_2$ --.

Column 4, line 34 delete "$(CH_3)_2S.BHBr_2$" and insert therefor -- $(CH_3)_2S \cdot BHBr_2$ --.

Column 5, line 46 delete "$(CH_3)_2S.BHBr_2$" and insert therefor -- $(CH_3)_2S \cdot BHBr_2$ --.

Column 6, line 7 delete "turbostratic" and insert therefor -- turbostatic --.

Column 6, line 13 delete "$(CH_3)_2S.BHBr_2$" and insert therefor -- $(CH_3)_2S \cdot BHBr_2$ --.

Column 6, line 15 delete "$(CH_3)_2S.BHBr_2$" and insert therefor -- $(CH_3)_2S \cdot BHBr_2$ --.

Column 6, line 29 delete "$(CH_3)_2S.BHBr_2$" and insert therefor -- $(CH_3)_2S \cdot BHBr_2$ --.

Column 6, line 32 delete "$(CH_3)_2S.BHBr_2$" and insert therefor -- $(CH_3)_2S \cdot BHBr_2$ --.

UNITED STATES PATENT AND TRADEMARK OFFICE
CERTIFICATE OF CORRECTION

PATENT NO. : 5,126,168
DATED : June 30, 1992
INVENTOR(S) : Sneddon et al.

It is certified that error appears in the above-identified patent and that said Letters Patent is hereby corrected as shown below:

Column 6, line 35 delete "$(CH_3)_2S.BHBr_2$" and insert therefor --$(CH_3)_2S \cdot BHBr_2$--.

Column 6, line 48 delete "$(CH_3)_2S.BHBr_2$" and insert therefor --$(CH_3)_2S \cdot BHBr_2$--.

Column 6, line 51 delete "$(CH_3)_2S.BHBr_2$" and insert therefor --$(CH_3)_2S \cdot BHBr_2$--.

Column 6, line 66 delete "$(CH_3)_2S.BHBr_2$" and insert therefor --$(CH_3)_2S \cdot BHBr_2$--.

Column 7, line 41 delete "M," and insert therefor --M',--.

Column 7, line 57 delete "$(CH_3)_2S.BHBr_2$" and insert therefor --$(CH_3)_2S \cdot BHBr_2$--.

Column 7, line 58 delete "$(CH_3)_2S.BBr_3$" and insert therefor --$(CH_3)_2S \cdot BBr_3$--.

Column 7, line 58 delete "$(CH_3)_2S.BH_3$" and insert therefor --$(CH_3)_2S \cdot BH_3$--.

Column 8, line 2 delete "$(CH_3)_2S.BHBr_2$" and insert therefor --$(CH_3)_2S \cdot BHBr_2$--.

Column 8, line 14 delete "$(R')(R'')_2S.BXYZ$" and insert therefor --$(R')(R'')_2S \cdot BXYZ$--.

Column 8, line 20 delete "$(R')(R'')_2S.BXYZ$" and insert therefor --$(R')(R'')_2S \cdot BXYZ$--.

UNITED STATES PATENT AND TRADEMARK OFFICE
CERTIFICATE OF CORRECTION

PATENT NO. : 5,126,168
DATED : June 30, 1992
INVENTOR(S) : Sneddon et al.

It is certified that error appears in the above-identified patent and that said Letters Patent is hereby corrected as shown below:

Column 8, line 29 delete "baseborane" and insert therefor --base-borane--.

Column 8, line 40 delete "$(R')(R'')_2S.BXYZ$" and insert therefor --$(R')(R'')_2S\cdot BXYZ$--.

Signed and Sealed this

Thirteenth Day of September, 1994

Attest:

BRUCE LEHMAN

Attesting Officer

Commissioner of Patents and Trademarks